(12) United States Patent
Hwang

(10) Patent No.: US 9,878,633 B2
(45) Date of Patent: Jan. 30, 2018

(54) BATTERY MONITORING APPARATUS AND BATTERY MONITORING METHOD

(71) Applicant: HYUNDAI AUTRON CO., LTD., Seongnam-si (KR)

(72) Inventor: Dong-Hyun Hwang, Seongnam-si (KR)

(73) Assignee: HYUNDAI AUTRON, CO., LTD., Seongnam-si (KR)

( * ) Notice: Subject to any disclaimer, the term of this patent is extended or adjusted under 35 U.S.C. 154(b) by 102 days.

(21) Appl. No.: 14/957,920

(22) Filed: Dec. 3, 2015

(65) Prior Publication Data

US 2016/0159242 A1 Jun. 9, 2016

(30) Foreign Application Priority Data

Dec. 3, 2014 (KR) ........................ 10-2014-0172339

(51) Int. Cl.
*H02J 7/00* (2006.01)
*B60L 11/18* (2006.01)

(52) U.S. Cl.
CPC ....... *B60L 11/1861* (2013.01); *B60L 11/1848* (2013.01); *B60L 11/1864* (2013.01); *Y02T 10/7005* (2013.01)

(58) Field of Classification Search
CPC .................................................. B60L 11/1861
USPC ......................................................... 320/109
See application file for complete search history.

(56) References Cited

U.S. PATENT DOCUMENTS

2014/0088896 A1* 3/2014 Hu ..................... G01R 31/3651
702/63

FOREIGN PATENT DOCUMENTS

| CN | 103419672 A | 12/2013 |
|----|----|----|
| CN | 103703604 A | 4/2014 |
| DE | 103 08 652 A1 | 9/2004 |
| DE | 20 2004 013 839 U1 | 11/2004 |
| DE | 10 2013 019 259 A1 | 7/2014 |
| JP | 2005-189030 A | 7/2005 |
| JP | 2007-033112 A | 2/2007 |

(Continued)

OTHER PUBLICATIONS

Korean Intellectual Property Office, Notice of Allowance for Korean patent application No. 10-2014-0172339, dated Apr. 28, 2016, Korea.

(Continued)

*Primary Examiner* — Suchin Parihar
(74) *Attorney, Agent, or Firm* — Baker & McKenzie LLP; Hyunho Park

(57) ABSTRACT

A battery monitoring apparatus that monitors a state of a battery for driving an electric motor includes: a voltage measuring unit configured to measure an analog voltage of each of battery cells; an A/D converter configured to convert the measured analog voltage of each of the battery cells to a digital voltage; a filter configured to perform filtering on the digital voltage converted by the A/D converter; and a control unit configured to receive a cell voltage from the A/D converter or from the filter depending on a change in battery cell voltage and/or a battery use time. The battery monitoring apparatus has advantages in that measurement precision can be increased while data rate is maintained by employing a hybrid filter which is a combination of an average filter and an IIR filter, so that the measurement precision can be increased with minimum additional cost.

10 Claims, 4 Drawing Sheets

(56) References Cited

FOREIGN PATENT DOCUMENTS

KR     10-2013-0129171 A     11/2013
KR     10-2013-0142952 A     12/2013

OTHER PUBLICATIONS

Deutsches Patent and Management Office, Office Action for German Patent Application No. 10 2015 120 458.4, dated Sep. 26, 2016.

\* cited by examiner

| SCHEME | BLOCK DIAGRAM | | DATA RATE | PRECISION | DATA DELAY |
|---|---|---|---|---|---|
| (a) | A/D CONVERTER CONTROL UNIT → | CONTROL UNIT | HIGH | LOW | LOW |
| (b) | A/D CONVERTER CONTROL UNIT → | AVERAGE FILTER → CONTROL UNIT | LOW | AVERAGE FILTER | AVERAGE FILTER |
| (c) | A/D CONVERTER CONTROL UNIT → | IIR FILTER → CONTROL UNIT | HIGH | AVERAGE FILTER | HIGH |
| (d) | A/D CONVERTER CONTROL UNIT → | HYBRID FILTER → CONTROL UNIT | AVERAGE FILTER | HIGH | AVERAGE FILTER |

FIG. 2

BATTERY MONITORING APPARATUS AND BATTERY MONITORING METHOD

CROSS REFERENCE TO RELATED APPLICATION

This application claims the benefit of Korean Patent Application No. 10-2014-0172339, filed on Dec. 03, 2014, entitled "BATTERY MONITORING APPARATUS AND BATTERY MONITORING METHOD," which is hereby incorporated by reference in its entirety into this application

BACKGROUND

1. Technical Field

Embodiments of the present disclosure relate to a battery monitoring apparatus and a battery monitoring method.

2. Description of the Related Art

Vehicles with an internal combustion engine powered mainly by gasoline or heavy oil are the main culprits of environmental pollution including air contamination. Therefore, in order to mitigate environmental pollution, much effort has recently been made to develop an electric vehicle or a hybrid electric vehicle.

Typically, an electric vehicle or a hybrid electric vehicle requires a large power of several tens of kW and thus a battery for driving a motor has to have a large capacity of several hundreds of V or several hundreds of A. To this end, a battery module is used in which battery cells are connected in series or in parallel.

For example, in a hybrid vehicle, forty to eighty battery cells charged to 200 V or 300 V may be connected to one another for driving a motor. In a fuel cell vehicle, even more battery cells, e.g., one hundred battery cells may be connected to one another.

Since the performance of the battery significantly affects the performance of the vehicle, a battery management system for measuring the voltage of each battery cell to efficiently manage the battery is required, not to mention the good performance of each battery cell.

SUMMARY

According to an exemplary embodiment of the present disclosure, different filters are selectively applied in different stages of the voltage characteristics curve of a lithium-ion battery, so that data rate and measurement precision can be increased as required.

According to another exemplary embodiment of the present disclosure, measurement precision can be increased while data rate is maintained by employing a hybrid filter which is a combination of an average filter and an IIR filter, so that the measurement precision can be increased with minimum additional cost.

It should be noted that objects of the present disclosure are not limited to the above-described objects, and other objects of the present disclosure will be apparent to those skilled in the art from the following descriptions.

In accordance with one aspect of the present disclosure, a battery monitoring apparatus that monitors a state of a battery for driving an electric motor includes: a voltage measuring unit configured to measure an analog voltage of each of battery cells; an A/D converter configured to convert the measured analog voltage of each of the battery cells to a digital voltage; a filter configured to perform filtering on the digital voltage converted by the A/D converter; and a control unit configured to receive a cell voltage from the A/D converter or from the filter depending on a change in battery cell voltage and/or a battery use time.

The control unit may receive a cell voltage from the A/D converter if the battery use time is below a predetermined time and the change in battery cell voltage is out of a predetermined range.

The control unit may receive a cell voltage from the filter if the battery use time is above a predetermined time and the change in battery cell voltage is within a predetermined range.

The A/D converter may convert the analog voltage to the digital voltage by performing oversampling and send the oversampled digital voltage to the filter or the control unit.

The filter may include: an average filter configured to perform average filtering on the oversampled digital voltage with a predetermined average coefficient; and an IIR filter configured to perform filtering on the oversampled digital voltage with a predetermined moving average coefficient.

In accordance with another aspect of the present disclosure, a battery monitoring method performed in a battery monitoring apparatus that monitors a state of a battery for driving an electric motor includes: measuring an analog voltage of each of battery cells to convert it to a digital voltage; calculating a change in battery cell voltage versus a battery use time; and receiving the digital voltage or a filtered digital voltage depending on the change in battery cell voltage and/or the battery use time.

The receiving may include receiving the digital voltage if the battery use time is below a predetermined time and the change in battery cell voltage is out of a predetermined range.

The receiving may include receiving the filtered digital voltage if the battery use time is above a predetermined time and the change in battery cell voltage is within a predetermined range.

The measuring may include converting the analog voltage to the digital voltage by performing oversampling.

The receiving may include receiving a digital voltage filtered by: an average filter configured to perform filtering on the oversampled digital voltage with a predetermined average coefficient and/or an IIR filter configured to perform filtering on the oversampled digital voltage with a predetermined moving average coefficient.

The above described and other features are exemplified by the detailed description and accompanying drawings.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims. Like reference numerals denote like elements throughout the descriptions.

BRIEF DESCRIPTION OF DRAWINGS

FIG. 2 is a table for illustrating a configuration scheme of a battery monitoring apparatus that is optimized for different stages of the voltage characteristics curve shown in FIG. 1;

DETAILED DESCRIPTION

Hereinafter, exemplary embodiments of the present disclosure will be described in detail with reference to the accompanying drawings.

Figure 1:
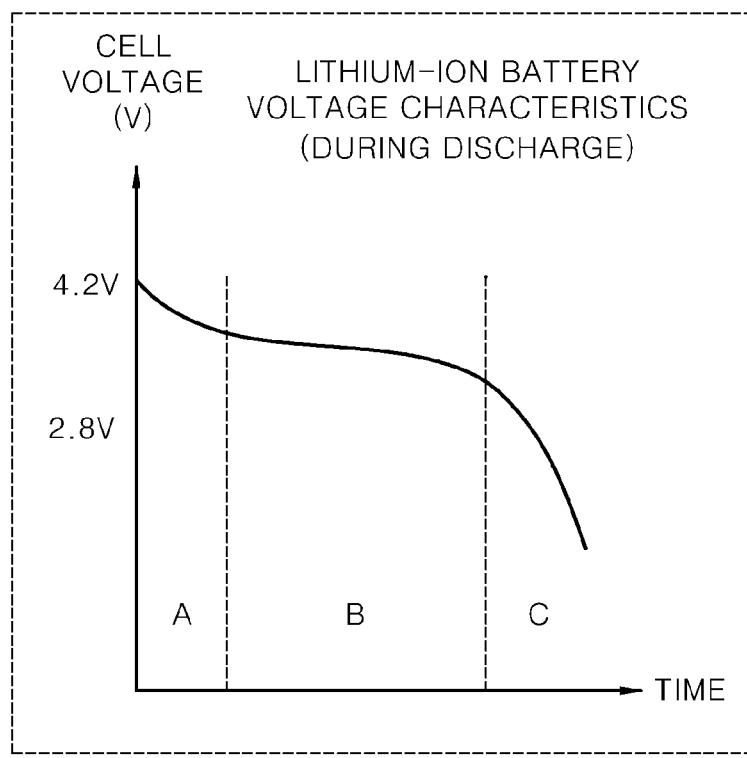
FIG. 1 is a graph showing voltage characteristics of a lithium-ion battery.

FIG. 1 is a graph showing voltage characteristics of a lithium-ion battery.

Referring to FIG. 1, a lithium-ion battery is charged to about 2.8 V to 4.2 V per cell and is discharged as time elapses. The battery cell voltage curve of a lithium-ion battery for an electric vehicle may be divided into three stages A, B and C.

In stage A, the battery use time is below a certain time and the change in battery cell voltage is out of a certain range. In stage B, the battery use time is above a certain time and the change in battery cell voltage is within a certain range. In stage C, the battery use time is below a certain time and the change in battery cell voltage is out of a certain range.

In stages A and C, the battery use time is below a certain time and accordingly the battery is less used, but the change in battery cell voltage is out of a certain range and accordingly faster measurement is required for monitoring fast change in the voltage.

On the contrary, in stage B, the battery use time is above a certain time and accordingly the battery is much used, and the change in battery cell voltage is within a certain range and accordingly precise measurement is required.

FIG. 2 is a table for illustrating a configuration scheme of a battery monitoring apparatus that is optimized for different stages of the voltage characteristics curve shown in FIG. 1.

According to scheme (a), a battery monitoring apparatus may include an A/D converter and a control unit. Upon receiving an analog voltage from a battery cell, the A/D converter converts the analog voltage to a digital voltage and sends it to the control unit.

According to scheme (a), the battery monitoring apparatus can measure data fast without delay since an analog voltage from a battery cell is converted to a digital voltage and then is directly output. However, measurement precision is relatively low.

Scheme (a) is appropriate for stages A and C where fast measurement is preferred for monitoring fast voltage change on the voltage characteristics curve of the lithium-ion battery of FIG. 1.

According to scheme (b), a battery monitoring apparatus may include an A/D converter, an average filter and a control unit.

Upon receiving an analog voltage from a battery cell, the A/D converter converts an analog voltage of the battery cell to a digital voltage and sends it to the average filter. The A/D converter may perform oversampling on the analog voltage to convert it to a digital voltage.

Although the precision is increased approximately twice by performing the oversampling on the analog voltage of the battery cell, the data processing rate is decreased approximately four to eight times.

The average filter receives the oversampled digital voltage from the A/D converter, and performs average filtering on the oversampled digital voltage with predetermined average coefficients to send it to the control unit.

Since the average filter performs the average filtering on the oversampled digital voltage with predetermined average coefficients, data that is not associated with any of the average coefficients may be dropped.

According to scheme (c), a battery monitoring apparatus may include an A/D converter, an IIR filter, and a control unit.

Upon receiving an analog voltage from a battery cell, the A/D converter converts the analog voltage of the battery cell to a digital voltage and sends it to the IIR filter. The A/D converter may perform oversampling on the analog voltage to convert it to a digital voltage.

The IIR filter receives the oversampled digital voltage from the A/D converter, and performs filtering on the oversampled digital voltage with predetermined moving average coefficients to send it to the control unit. Although the filtering precision is increased since the IIR filter adjusts time delay in performing the filtering, data is delayed.

To overcome the above drawbacks, the present disclosure proposes a battery monitoring apparatus according to scheme (d). The battery monitoring apparatus according to scheme (d) combines the configuration according to scheme (b) and the configuration according to scheme (c). Hereinafter, the battery monitoring apparatus will be described in detail with reference to FIG. 3.

Figure 3:
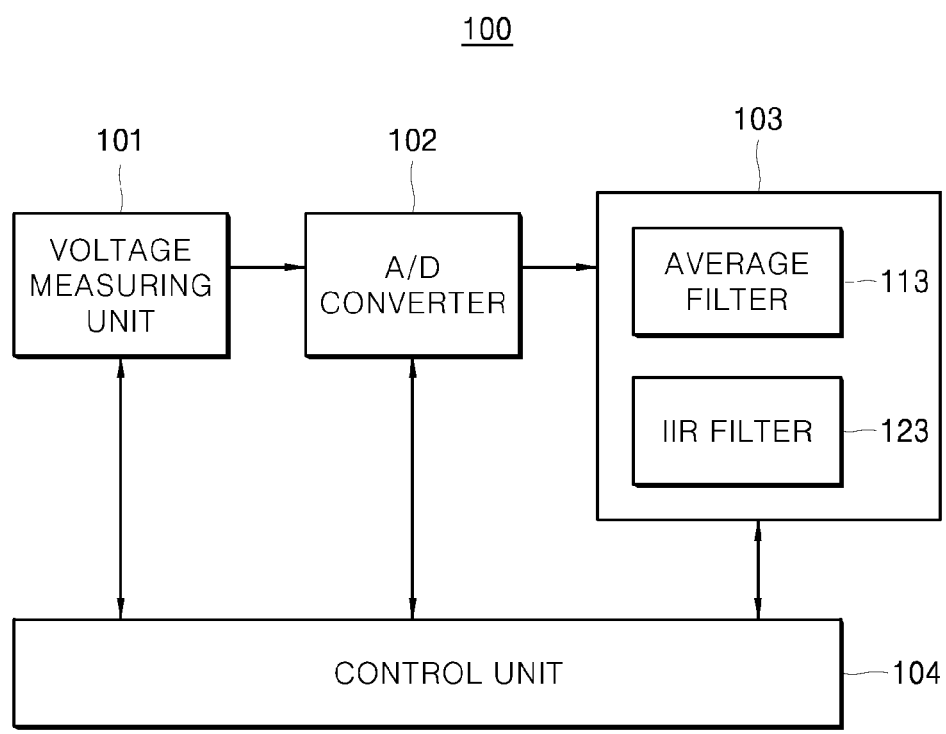
FIG. 3 is a block diagram for illustrating a configuration of a battery monitoring apparatus according to an exemplary embodiment of the present disclosure.

FIG. 3 is a block diagram for illustrating a configuration of a battery monitoring apparatus according to an exemplary embodiment of the present disclosure.

Referring to FIG. 3, a battery monitoring apparatus 100 includes a voltage measuring unit 101, an A/D converter 102, a hybrid filter 103 and a control unit 104.

The voltage measuring unit 101 measures an analog voltage of a battery cell to send it to the A/D converter 102.

The battery includes sub-packs connected in series. Each of the sub-packs includes secondary battery cells connected in series. For example, the battery may include eight sub-packs connected in series, and each of sub-packs may include five secondary battery cells, so that the battery may include a total of forty battery cells.

The A/D converter 102 converts the analog voltage received from the voltage measuring unit 101 to a digital voltage under the control of the control unit 104 and sends it to the hybrid filter 103 or the control unit 104.

In an exemplary embodiment, the A/D converter 102 may convert an analog voltage to a digital voltage by performing oversampling, and may send the oversampled digital voltage to the hybrid filter 103 or the control unit 104.

The hybrid filter 103 receives the oversampled digital voltage from the A/D converter 102 under the control of the control unit 104, and performs filtering on the oversampled digital voltage.

In an exemplary embodiment, the hybrid filter 103 may work under the control of the control unit 104 only when the battery use time is above a certain time while the change in battery cell voltage is within a certain ranged. For example, the hybrid filter 103 may work only in stage B of FIG. 1.

In an alternative embodiment, the hybrid filter 103 may not work when the battery use time is below a certain time while the change in battery cell voltage is out of a certain range. For example, the hybrid filter 103 may not work in stages A and C of FIG. 1.

The hybrid filter 103 may include an average filter 113 and an IIR filter 123.

The average filter 113 performs average filtering on the oversampled digital voltage with predetermined average coefficients.

The IIR filter 123 performs filtering on the oversampled digital voltage with predetermined moving average coefficients.

The control unit 104 receives the voltage of a battery cell from the voltage measuring unit 101 and calculates a change in battery cell voltage versus battery use time. The control unit 104 receives a cell voltage from the A/D converter 102 or from the hybrid filter 103 depending on the battery use time and the change in battery cell voltage.

In an exemplary embodiment, when the battery use time is below a certain time while the change in battery cell voltage is out of a certain range, the control unit 104 controls the A/D converter 102 so that the digital voltage converted by the A/D converter 102 is not sent to the hybrid filter 103, and the control unit 104 receives the digital voltage from the A/D converter 102. In the exemplary embodiment, the hybrid filter 103 does not perform any operation.

For example, the control unit 104 may receive a digital voltage from the A/D converter 102 in stages A and C of FIG. 1 where the battery use time is below a certain time while the change in battery cell voltage is out of a certain range.

In an alternative embodiment, the control unit 104 controls the A/D converter 102 so that the digital voltage converted by the A/D converter 102 is sent to the hybrid filter 103 when the battery use time is below a certain time while the change in battery cell voltage is out of a certain range. The control unit 104 may receive a filtered digital voltage from the hybrid filter 103. In the exemplary embodiment, the control unit 103 may receive no digital voltage from the A/D converter 102.

For example, the control unit 104 may receive a digital voltage from the hybrid filter 103 in stage B of FIG. 1 where the battery use time is above a certain time while the change in battery cell voltage is within a certain range.

Figure 4:
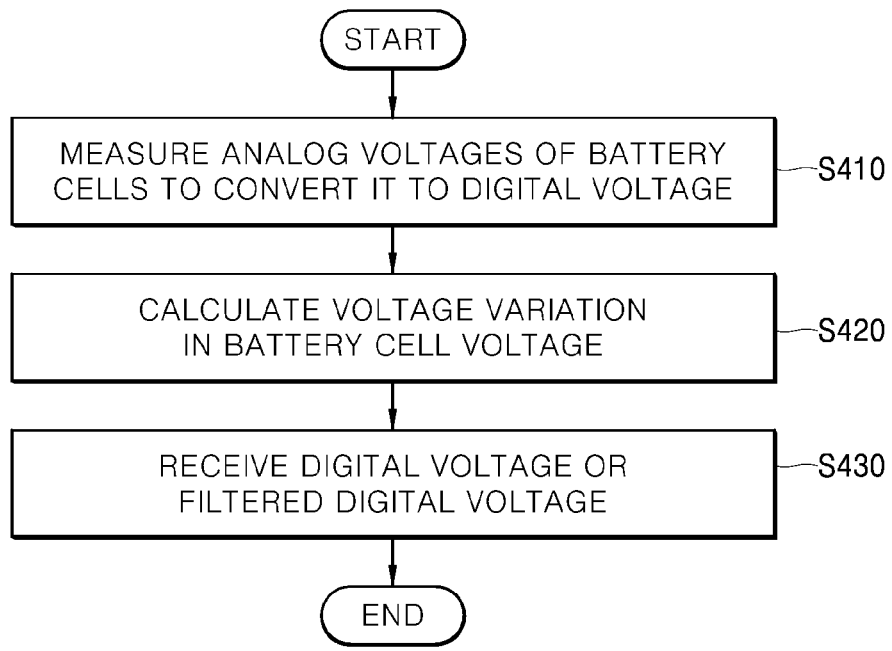
FIG. 4 is a flow chart for illustrating a battery monitoring method according to an exemplary embodiment of the present disclosure.

FIG. 4 is a flow chart for illustrating a battery monitoring method according to an exemplary embodiment of the present disclosure.

Referring to FIG. 4, a battery monitoring apparatus 100 measures an analog voltage of a battery cell and converts it to a digital voltage (step S410).

In an exemplary embodiment of step S410, the battery monitoring apparatus 100 may convert an analog voltage to a digital voltage by performing oversampling.

The battery monitoring apparatus 110 calculates a change in battery cell voltage versus battery use time (step S420). The battery monitoring apparatus 100 receives a digital voltage or a filtered digital voltage depending on the battery use time and the change in battery cell voltage (step S430).

In an exemplary embodiment of step S430, the battery monitoring apparatus 100 may receive the digital voltage when the battery use time is below a certain time while the change in battery cell voltage is out of a certain range.

In alternative embodiment of step S430, the battery monitoring apparatus 100 may receive the filtered digital voltage when the battery use time is above a certain time while the change in battery cell voltage is within a certain range.

According to an exemplary embodiment of the present disclosure, different filters are selectively applied in different stages of the voltage characteristics curve of a lithium-ion battery, so that data rate and measurement precision can be increased as required.

According to another exemplary embodiment of the present disclosure, measurement precision can be increased while data rate is maintained by employing a hybrid filter which is a combination of an average filter and an IIR filter, so that the measurement precision can be increased with minimum additional cost.

Thus far, although specific exemplary embodiments of the present disclosure have been described, various modifications may be made without departing from the scope of the present disclosure. Accordingly, the scope of the present disclosure is not construed as being limited to the above-described exemplary embodiments, but is defined by the following claims as well as equivalents thereof.

Although the present disclosure has been described with reference to the exemplary embodiments and the accompanying drawings, it is not limited to the above-described exemplary embodiments, but may be variously modified and altered from the above description by those skilled in the art. Therefore, the scope and spirit of the present disclosure should be defined only by the following claims, and all of the equivalences and equivalent modifications of the claims should be intended to fall within the scope and spirit of the present disclosure

What is claimed is:

1. A battery monitoring apparatus for monitoring a state of a battery for an electric motor, the apparatus comprising:
    a voltage measuring unit configured to measure an analog voltage of each of battery cells;
    an A/D converter configured to convert the measured analog voltage of each of the battery cells to a digital voltage;
    a filter configured to perform filtering on the digital voltage converted by the A/D converter; and
    a control unit configured to determine whether to send the digital voltage to the filter from the A/D converter depending on a change in battery cell voltage or a battery use time,
    wherein the digital voltage is sent to the filter from the A/D converter when the battery use time is above a predetermined time and the change in battery cell voltage is within a predetermined range.

2. The battery monitoring apparatus of claim 1, wherein the control unit is configured to receive a cell voltage from the A/D converter if the battery use time is below the predetermined time and the change in battery cell voltage is out of the predetermined range.

3. The battery monitoring apparatus of claim 1, wherein the control unit is configured to receive a cell voltage from the filter if the battery use time is above the predetermined time and the change in battery cell voltage is within the predetermined range.

4. The battery monitoring apparatus of claim 1, wherein the A/D converter is configured to convert the analog voltage to the digital voltage by performing oversampling and to send the oversampled digital voltage to the filter or the control unit.

5. The battery monitoring apparatus of claim 4, wherein the filter comprises;
    an average filter configured to perform average filtering on the oversampled digital voltage with a predetermined average coefficient; and
    an IIR filter configured to perform filtering on the oversampled digital voltage with a predetermined moving average coefficient,
    wherein the average filter or the IIR filter is selected based on a stage of voltage characteristics of the battery to filter the digital voltage.

6. A battery monitoring method, the method comprising:
    measuring an analog voltage of each of battery cells to convert it to a digital voltage;

calculating a change in battery cell voltage versus a battery use time; and determining whether to send the digital voltage to a filter from an A/D converter depending on the change in battery cell voltage and/or the battery use time, wherein the digital voltage is sent to the filter from the A/D convert when the battery use time is above a predetermined time and the change in battery cell voltage is within a predetermined range.

7. The battery monitoring method of claim 6, wherein the method further comprises receiving the digital voltage if the battery use time is below the predetermined time and the change in battery cell voltage is out of the predetermined range.

8. The battery monitoring method of claim 6, wherein the method further comprises receiving the filtered digital voltage if the battery use time is above the predetermined time and the change in battery cell voltage is within the predetermined range.

9. The battery monitoring method of claim 6, wherein the measuring comprises converting the analog voltage to the digital voltage by performing oversampling.

10. The battery monitoring method of claim 9, wherein the method further comprises:

receiving a digital voltage filtered by an average filter configured to perform filtering on the oversampled digital voltage with a predetermined average coefficient and/or an IIR filter configured to perform filtering on the oversampled digital voltage with a predetermined moving average coefficient, and selecting the average filter or the IIR filter based on a stage of voltage characteristics of the battery to filter the digital voltage.

* * * * *